(12) United States Patent
Küepper et al.

(10) Patent No.: US 8,647,710 B2
(45) Date of Patent: Feb. 11, 2014

(54) COATED SUBSTRATE WITH A CURVED SURFACE, AND A METHOD FOR PRODUCTION OF A COATED SUBSTRATE SUCH AS THIS

(75) Inventors: Thomas Küepper, Bad Gandersheim (DE); Dieter Wittenberg, Osterode (DE); Christoph Moelle, Bad Gandersheim (DE); Lutz Zogg, Bad Gandersheim (DE)

(73) Assignee: Schott AG, Mainz (DE)

( * ) Notice: Subject to any disclaimer, the term of this patent is extended or adjusted under 35 U.S.C. 154(b) by 940 days.

(21) Appl. No.: 11/181,953

(22) Filed: Jul. 14, 2005

(65) Prior Publication Data

US 2006/0013997 A1    Jan. 19, 2006

(30) Foreign Application Priority Data

Jul. 15, 2004   (DE) .......................... 10 2004 034 417

(51) Int. Cl.
*B05D 5/06* (2006.01)
*B32B 1/00* (2006.01)
*B32B 17/06* (2006.01)

(52) U.S. Cl.
USPC ........... 427/162; 427/164; 427/165; 427/166; 427/168; 428/174; 428/426

(58) Field of Classification Search
USPC .......... 427/162, 164, 165, 166, 168; 428/174, 428/426
See application file for complete search history.

(56) References Cited

U.S. PATENT DOCUMENTS

| | | | |
|---|---|---|---|
| 2,916,396 A | 12/1959 | Perrenod | |
| 3,396,837 A * | 8/1968 | Schmelzle et al. | 428/337 |
| 4,327,129 A | 4/1982 | Sepp | 427/164 |
| 4,604,297 A * | 8/1986 | Liu | 427/64 |
| 4,953,459 A * | 9/1990 | Ericsson | 101/115 |
| 5,503,677 A | 4/1996 | Mörsen et al. | |
| 5,587,626 A | 12/1996 | Parham et al. | |
| 6,849,308 B1 | 2/2005 | Speakman et al. | |
| 2001/0003871 A1 | 6/2001 | Patton et al. | 33/18.1 |
| 2004/0046969 A1 | 3/2004 | Anderson | 356/630 |

FOREIGN PATENT DOCUMENTS

| | | | |
|---|---|---|---|
| DE | 2557667 | 7/1976 | |
| DE | 2710860 | 12/1977 | C23C 17/00 |
| DE | 2710860 | 4/1979 | |

(Continued)

OTHER PUBLICATIONS

German Office Action dated Jul. 15, 2005.

(Continued)

*Primary Examiner* — David Turocy
*Assistant Examiner* — Michael G Miller
(74) *Attorney, Agent, or Firm* — Ohlandt, Greeley, Ruggiero & Perle, LLP

(57) ABSTRACT

A method for production of a substrate having a patterned optical coating on a curved surface is provided. The method includes applying a masking to a sub-area of the curved surface applying an optical coating using a vacuum deposition method, and removing the masking. A coated substrate, which can be produced in particular by the method described above, is also provided. The coated substrate includes a curved surface that is provided with at least one patterned optical coating. The at least one patterned optical coating is provided on at least one sub-area of the curved surface and is missing on at least one adjacent sub-area.

25 Claims, 7 Drawing Sheets

(56) References Cited

FOREIGN PATENT DOCUMENTS

| | | | |
|---|---|---|---|
| DE | 3612694 | 10/1987 | |
| DE | 4313521 | 6/1994 | ................ B44F 1/12 |
| DE | 4443354 | 6/1995 | ............... H01J 61/35 |
| DE | 4313521 | 6/1997 | |
| EP | 0753082 | 1/1997 | .............. C23C 16/52 |
| EP | 0753082 | 7/1999 | |
| JP | 56065980 | 6/1981 | .............. C23C 13/06 |
| JP | S58153777 | 9/1983 | |
| JP | 3123675 | 5/1991 | |
| JP | 04026780 | 1/1992 | ................ C23F 1/00 |
| JP | 6324470 | 11/1994 | |
| JP | H07262973 | 10/1995 | |
| JP | 2004086002 | 3/2004 | |
| WO | WO03099456 | 12/2003 | |

OTHER PUBLICATIONS

Search Report dated Oct. 21, 2009 for corresponding Japanese Patent Application No. 2005-068651.

Office Action dated Aug. 9, 2010 for corresponding German Patent Application No. 10 2004 064 077.7-45.

English translation of the Office Action dated Aug. 9, 2010 for corresponding German Patent Application No. 10 2004 064 077.7-45.

* cited by examiner

COATED SUBSTRATE WITH A CURVED SURFACE, AND A METHOD FOR PRODUCTION OF A COATED SUBSTRATE SUCH AS THIS

CROSS-REFERENCE TO RELATED APPLICATIONS

The present application is claiming priority of German Patent Application No. 10 2004 034 417.5-45, filed on Jul. 15, 2004, the content of which is herein incorporated by reference.

BACKGROUND OF THE INVENTION

1. Field of the Invention

The invention relates to the coating of substrates with optical layers, in particular to the coating of curved surfaces with layers such as these.

2. Description of Related Art

The coating of curved surfaces with optical layers is known, for example, from lens manufacture, in which lenses are provided with blooming layers. However, layers such as these generally cover the entire refractive surface of the lens.

However, on the other hand, there is a requirement to also provide curved surfaces, where appropriate, with optical layers in a structured form over their area extent, in order, by way of example, to achieve specific visual effects.

BRIEF SUMMARY OF THE INVENTION

The invention is thus based on the object of improving the coating of substrates with optical layers such that the layers are structured laterally, are segmented, or are patterned along the substrate surface to be coated.

This object is achieved in a very highly surprisingly simple manner by means of a method and a coated substrate of the present invention. Advantageous refinements and developments to the present invention are also provided.

Accordingly, the invention provides a method for production of a substrate having a patterned or laterally structured optical coating on a curved surface, in which masking which covers a subarea of the curved surface is applied to the curved surface, an optical coating is applied using a vacuum deposition method, and the masking is removed.

A coated substrate according to the invention, which can be produced in particular by means of the method according to the invention, accordingly has a curved surface which is provided with a patterned optical coating such that the optical coating, in particular a vacuum coating, is provided on at least one subarea of this surface, and is missing on at least one adjacent or neighboring subarea. The optical coating is in this case applied during the production of the substrate according to the invention to the substrate on the subarea or subareas which has or have been cut out of the masking, and is missing on the adjacent areas which are covered by the masking.

A patterned coating for the purposes of the invention is accordingly a coating which has been segmented along its area extent, with the segmented coating having at least one segment.

By virtue of the masking and the vacuum deposition of the optical coating, the invention results in curved substrates with patterned optical coatings in which the edges of contours of the pattern are well defined and clear.

There are no restrictions with regard to the suitability of a substrate for the invention, provided that the substrate can be coated in a vacuum. By way of example, glass, glass-ceramic, metal or plastic substrates are suitable. In particular, this is intended to cover the use of optical components as substrates, and their improvements by means of the invention.

Various vacuum deposition methods are suitable for the deposition process. The choice of the deposition method may in this case depend on various selection criteria, including the choice of the coating material or the geometry of the surface to be coated. According to one embodiment of the method according to the invention, the application of the optical coating comprises the deposition of a layer by means of physical vapor deposition (PVD). This may comprise, for example, vapor deposition or sputtering of a layer. Vapor deposition allows high deposition rates to be achieved, while sputtering is also suitable for materials which are difficult to vaporize. A layer can also be applied by means of chemical vapor deposition (CVD). For example, the layer may be deposited by means of plasma-pulse induced chemical vapor deposition (PICVD).

According to another embodiment of the invention, the masking of the substrate comprises the application of a varnish layer. In order to produce a varnish layer which is structured over its area extent, it is possible according to one advantageous development to apply the varnish layer by means, for example, of at least one computer-controlled nozzle. An appropriately adapted printing head is particularly suitable for this purpose, as is used, for example, in ink jet printers. Both a piezo jet print head and a bubble jet print head may be used. This allows a varnish layer which is structured over its area extent to be produced directly as masking or as part of the masking of the surface to be coated, by printing it on.

In order to keep the distance between the print head or nozzle and the curved surface within tolerable limits, for example in the case of highly curved surfaces, it is possible according to one development of this embodiment of the invention to adapt or readjust the distance between the print head or nozzle and the curved surface during the application of the varnish layer.

The invention accordingly also covers a method and an apparatus for coating of curved and/or polygonal substrates, in which varnish is applied to the surface to be coated by means of a computer-controlled print head, with the distance between the at least one nozzle of the print head and the curved and/or polygonal substrate surface being readjusted under computer control by means of a suitable device. This allows the varnish application process to be controlled in three dimensions.

Various measures for varnish application are advantageous in order in particular to produce clear contours in the patterned varnish layer and to ensure a uniform printed image. For example, the varnish may be cooled. If a nozzle is used for varnish application, for example as a component of a print head, it may also be advantageous to cool the varnish in a supply container, which is connected to the nozzle, in a supply line or by means of the nozzle, in order to reduce the vaporization of the solvent in the varnish before application and thus to prevent clogging of the printing device. A further possible way to prevent clogging of the nozzle or of the print head is for the substrate to be printed in a suitable atmosphere. The atmosphere may, for example be compressed for this purpose, and/or may be an atmosphere containing solvent, in order to prevent drying out.

As soon as the varnish has been applied, it is once again desirable to solidify the varnish as quickly as possible in order to prevent it from running on the curved surface and thus to achieve good contour clarity. It is also desirable to remove any solvent that is contained, in order to reduce the outgassing of the varnish layer in the vacuum chamber. One suitable measure for this purpose is to apply the varnish to a heated substrate, in order to speed up the vaporization of the solvent.

According to yet another further embodiment of the invention, the masking of the substrate may also comprise coating with photoresist, and exposure and development of the photoresist.

According to yet another embodiment of the method, pull-off varnish is used for masking. This can easily be detached from the substrate once the coating process has been carried out.

One preferred embodiment of the invention provides for the masking of the substrate to comprise the application of a stop varnish, as is used, by way of example, as a solder stop varnish in printed circuit board technology. This varnish has been found to be particularly compatible with vacuums and to be thermally stable when subjected to the temperature load that occurs during coating.

Another embodiment of the invention provides for the masking of this substrate to comprise the arrangement of a mechanical mask. This is reusable and is suitable for covering larger areas, without outgassing in a vacuum. A preformed metal foil or plastic sheet, cut to match the pattern of the optical coating to be deposited, may be used, by way of example, as a mask. Owing to its low outgassing rate and temperature resistance, polyimide, such as Kapton®, is suitable, by way of example, as a plastic for a mask such as this.

The various masking methods may also, in particular, advantageously be combined with one another. One advantageous development of the invention therefore provides for the masking of the substrate to comprise the application of first masking and the second masking, which overlaps the first masking. This makes it possible, for example, to combine precisely structured varnish layer masking with sharp, well-defined edges with other, coarser masking for larger areas to be covered. For example, initial masking using a pull-off varnish or a mechanical mask, such as a metal foil or polyimide sheet (for example a Kapton® sheet) can be used together with varnish masking for precise contours for the edges of the area to be covered.

The removal of the masking after the deposition of the optical coating may, according to a further embodiment of the invention, comprise dissolving or etching of varnish masking. The dissolving or etching of the varnish masking then also lifts off the deposited optical coating located on the varnish layer, so that an optical coating, patterned in accordance with the masking, remains on those subareas of the curved surface of the substrate which were not covered by the masking.

A further possible way to remove the masking and the optical coating located on it is swelling of the varnish masking. For example, the varnish layer can be treated with a suitable lye for this purpose. The swelling process results in the varnish layer being torn off the substrate, and being detached together with the optical coating on it.

An optical coating which can be produced according to the invention may also have two or more layers. For example, a multilayer coating such as this may be used as an optical interference layer.

A further option for optical coating on the curved surface is a coating which comprises a partially or fully reflective reflection layer. A layer such as this may also be in the form of a colored-reflective layer. In order to achieve color effects, the substrate may, according to the invention, also be provided with a patterned optical layer which comprises a color or absorption layer.

A large number of substrates are suitable for use of the invention. One specific embodiment of the invention provides for a lamp bulb to be used as the substrate, and to be coated. A patterned optical coating according to the invention on a lamp bulb makes it possible, for example, to advantageously influence the light field of the lamp bulb in a highly defined manner.

A further specific embodiment provides for a lens to be coated as the substrate. A lens such as this with a patterned optical coating also makes it possible to deliberately influence, for example, the light field of a lamp.

One development of the method according to the invention also provides for different subareas of the curved surface to be successively provided with an optical layer by masking and vacuum coating. In particular, this also makes it possible to produce a patterned optical coating which has subareas with different optical characteristics. The subareas can advantageously be provided with different optical coatings for this purpose. For example, a coated substrate according to the invention whose curved surface has two or more subareas with different coatings can be used to deliberately influence the light passing through or the reflected light in different directions or spatial angle segments or areas.

By way of example, an annular subarea of the curved surface of the substrate can be provided with the optical layer in order to influence the light field of an optical device in a desired manner using a coated substrate according to the invention.

A further application option is a patterned coating which comprises visible information. This information may be perceived by the viewer and may be used, for example, as source information. For example, the coating may represent a visible symbol or logo, or an inscription. In order to influence the light field to a minor extent or not at all in this way, a coating containing the information may also be in the form of a transparent or partially transparent coating in an area which has little relevance for illumination.

One intended practical application of the invention is a motor vehicle spotlight or headlight having a coated substrate according to the invention. As a component of the spotlight or headlight, the substrate may, for example, comprise a lamp bulb and/or a projection lens. The light field of the spotlight or headlight can then be influenced by means of a lamp bulb such as this according to the invention or by means of a coated projection lens according to the invention, inter alia to decrease dazzling effects for the drivers of oncoming vehicles.

The invention will be explained in more detail in the following text using exemplary embodiments and with reference to the drawings, in which identical and similar elements are provided with the same reference symbols and the features of different exemplary embodiments can be combined with one another.

DETAILED DESCRIPTION OF THE INVENTION

Figure 1A:
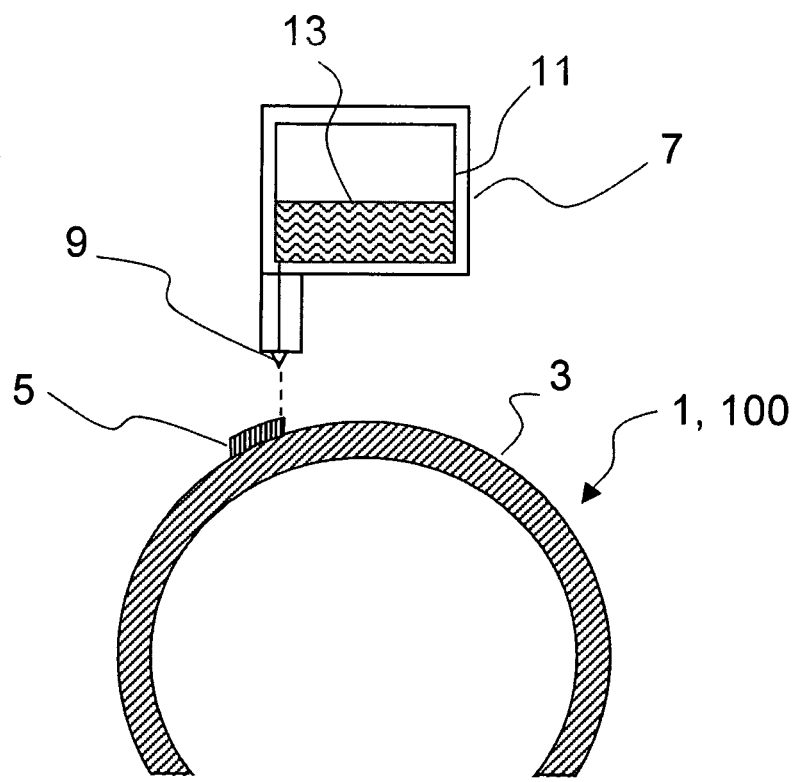
FIGS. 1A to 1D show method steps for the production of a coated substrate according to the invention with a curved surface.

Method steps for the production of a substrate 1 coated according to the invention, based on a first embodiment of the invention, will be described with reference to FIGS. 1A to 1D, which show schematic cross-section views of a substrate 1 with a curved surface.

The method for production of a substrate having a patterned optical coating on a curved surface, as is illustrated in FIGS. 1A to 1D, is based on the idea that, masking which covers a subarea of the curved surface 3 is applied to the curved surface 3 of the substrate 1, an optical coating is applied using a vacuum deposition method, and the masking is removed.

According to this first embodiment of the invention, which is illustrated in FIGS. 1A to 1D, the substrate 1 is masked by the application of a varnish 13, with the varnish 13 being applied by means of computer-controlled nozzles 9. According to this embodiment of the method, the varnish 13 is for this purpose printed by means of a print head 7 with nozzles 9 and which is connected to a computer, which is not illustrated in FIG. 1A. The print head as well as a device for movement of the print head 7 are controlled by the computer.

Any desired material which can be coated by means of a vacuum deposition method may be used for the substrate. Intended examples of this include, for example, glass, glass-ceramic, ceramic, plastic and/or metal. For example, as is shown in FIGS. 1A to 1D, a lamp bulb 100 may be used as the substrate 1. There are also a wide range of application options for the coating, according to the invention, of a lens as the substrate.

The varnish 13 may, for example, be a photoresist, a pull-off varnish or else a stop varnish, in particular such as a solder stop varnish from printed circuit board manufacture.

An ink jet print head is particularly suitable for use as the print head 7. A print head such as this allows a patterned varnish layer 5 to be produced with particularly clear, well-defined edges.

In order to keep the distance between the print head 7, for example its nozzles 9, and the curved surface 3 within tolerable limits for production of patterns with clear edges on the varnish layer 5 during the application of the varnish 13, this distance may, according to one variant of this embodiment, additionally be adapted or readjusted by means of a suitable computer-controlled device.

Various further measures may also be adopted in order to improve the application of the varnish. For example, the varnish 13 may be cooled in the supply container 11 and/or in the supply line to the nozzles 9 and/or else in the nozzle, in particular by means of a cooled nozzle, in order to reduce the vaporization of the solvent in the varnish before application, and thus to prevent the clogging of the nozzle in the print head 7. The printing process can also be carried out in a suitable environment, for example in a compressed atmosphere, and/or in an atmosphere containing solvents.

In order to remove the solvent contained in the varnish of the varnish layer 5 and solidify the varnish layer as quickly as possible after the printing process, and to prevent running in order to achieve high contour clarity, the substrate may, for example, also be preheated during printing.

Figure 1B:
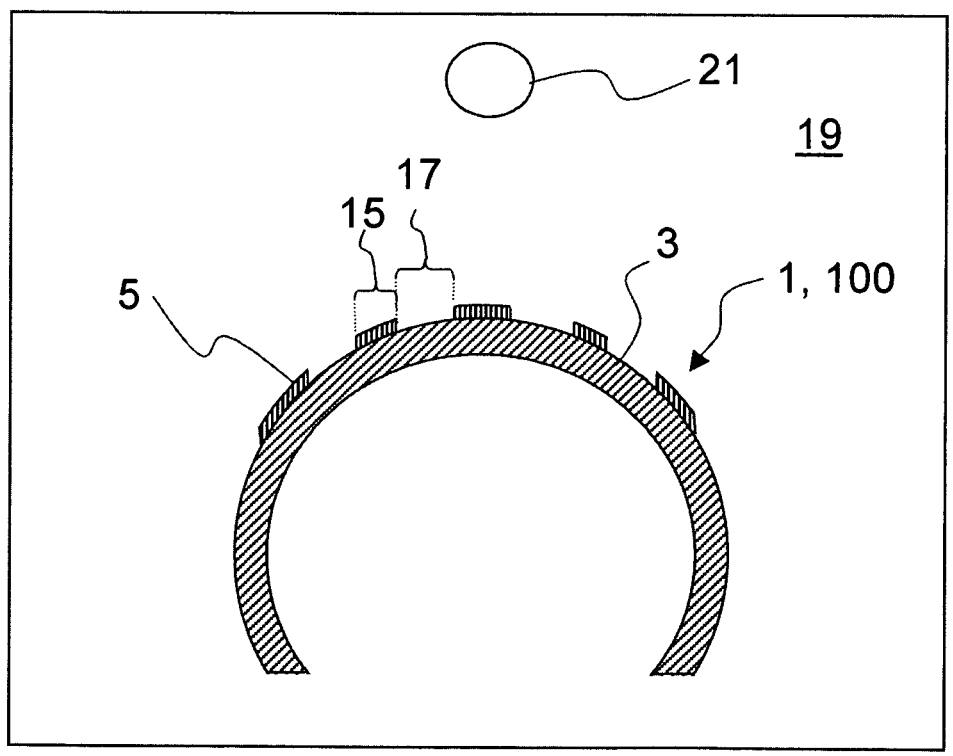

FIG. 1B shows a further phase of the production process. The masking of the substrate 1 with the varnish layer 5 has been completed. Subareas 15 of the curved surface 3 of the substrate 1 are masked by the varnish of the varnish layer 5, while in contrast other subareas 17 remain open, as a result of the patterning of the varnish layer 5.

The substrate 1 provided with the patterned varnish layer 5 is arranged in a vacuum chamber 19 opposite or in a symbolically illustrated coating source 21. The coating source 21 is then used, in the evacuated coating chamber 19, for vacuum deposition of an optical layer on the curved surface 3 of the substrate 1 that has been provided with the patterned varnish layer 5.

Vacuum deposition of an optical coating may comprise, for example, the deposition of a layer by means of physical vapor deposition. The coating source 21 may, according to one development, for this purpose comprise a vaporization device, with the application of the optical coating then comprising the application of a layer by vapor deposition. According to another development, the application of the optical coating comprises the sputtering of a layer. The coating source 21 is in this case accordingly a sputter source.

An optical coating or a component of this coating may likewise also be deposited on the surface 3 by means of chemical vapor deposition by means of an appropriately designed coating source 21. One preferred development of this embodiment provides for the layer to be produced by means of plasma-pulse induced chemical vapor deposition (PICVD). For this purpose, the coating source 21 comprises, for example, a gas inlet for suitable precursor gases, for example gaseous educts and a device for production of pulse electromagnetic waves, by means of which a pulsed plasma is produced in the precursor gas atmosphere. Reaction products are produced in the plasma, are deposited on the surface 3 and may react with one another, so that a layer is deposited on the surface 3.

Figure 1C:
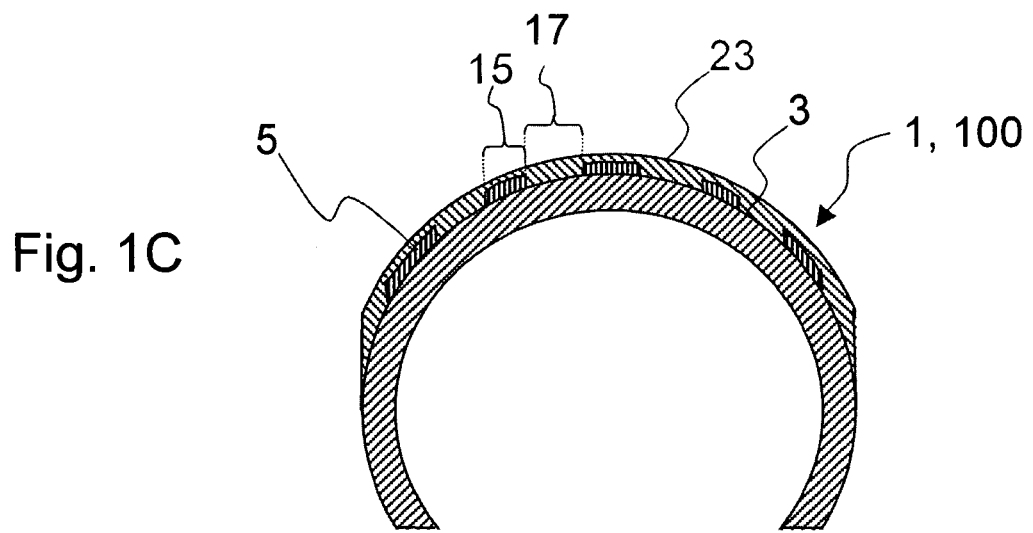

The substrate 1 coated by means of vacuum deposition is illustrated in FIG. 1C. In a corresponding manner to the previous method steps, the substrate is now masked in the form of a patterned varnish layer 5 on the curved surface 3, by means of such subareas 15 of the surface 3 are masked and other subareas 17 are open. An optical coating 23 is applied by means of vacuum deposition over the surface 3, including the masking. This coating makes contact with the substrate 14, or with its surface 3, in those subareas 17 which have been left open by the patterned varnish layer 5. The next step is now to remove the masking. For this purpose, the varnish layer may, for example, be dissolved or etched by means of a suitable solvent. A further option is to allow the varnish layer to swell. A lye such as a potassium or soda lye, may be used for this purpose. The use of swelling to remove the varnish layer is particularly suitable when using stop varnish which, furthermore, has good temperature resistance and a low outgassing rate in a vacuum.

In both cases, the patterned varnish layer 5 is removed from the curved surface 3, so that the optical coating 23 located in the areas 15 on the varnish layer 5 is also removed, and all that remains on the surface 3 is the optical coating 23 in the subareas 17 which were not covered by the pattern varnish layer 5.

Figure 1D:
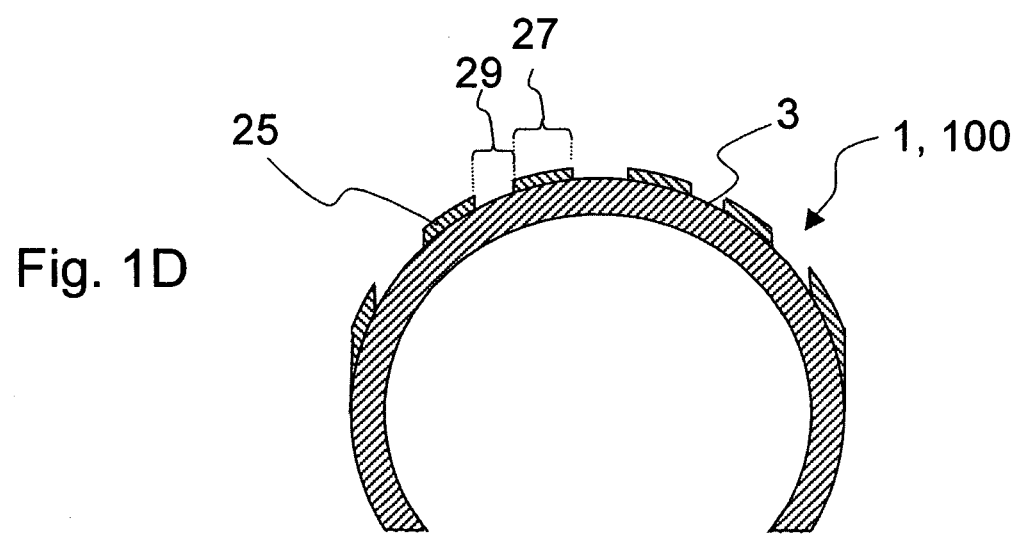

FIG. 1D illustrates one exemplary embodiment of a coated substrate according to the invention as a product of this embodiment of the method. This coated substrate 1 accordingly has a curved surface 3 which is provided with a patterned optical coating 25 in such a way that the optical coating 25 is present in at least one subarea 27 on this surface 3, and is missing in at least one adjacent subarea 29.

The patterned optical coating 25 was in this case produced, as described above, by removal of the varnish layer 5 together with the optical coating 23 on the masked areas 15. Those subareas 27 which are covered by the patterned optical coating 25 accordingly correspond to those areas of the curved surface 3 which are not covered by the patterned varnish layer 5, while the adjacent subareas 29 on which there is no optical coating 25 correspond to those areas 15 which were previously covered by the patterned varnish layer 5.

Figure 2:
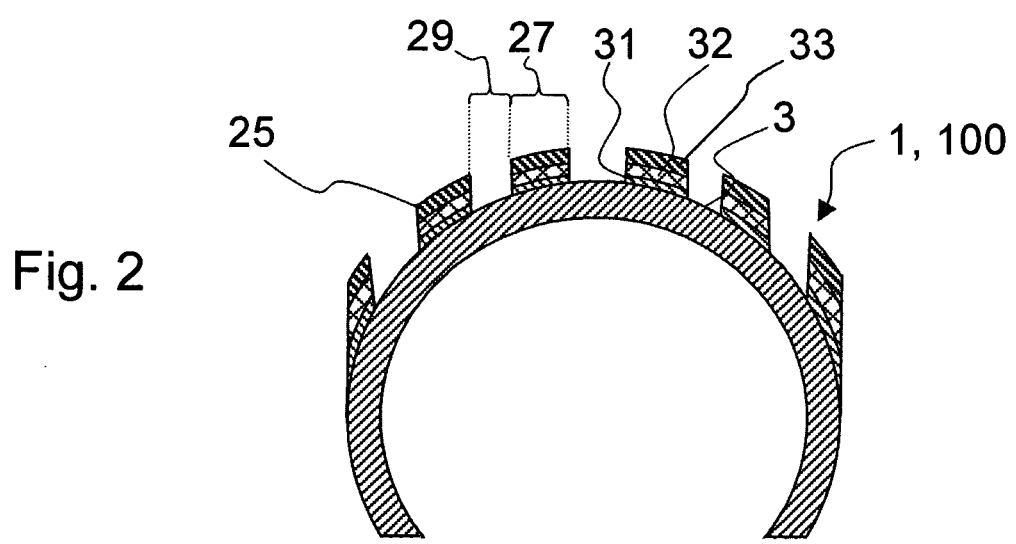
FIG. 2 shows a variant of the coated substrate illustrated in FIG. 1D, FIGS. 3A to 3D show method steps for the production of a coated substrate according to the invention with a curved surface, according to further embodiments of the invention.

FIG. 2 shows a further exemplary embodiment of a coated substrate 1 according to the invention, which can be obtained by means of a variant of the method steps described with reference to FIGS. 1A to 1D.

In contrast to the exemplary embodiment shown in FIG. 1D, the coated substrate 1 illustrated in FIG. 2 has a multi-layer patterned optical coating 25 with layers 31, 32, 33. A multilayer optical coating 25 such as this can be applied by depositing a number of layers 31, 32, 33 sequentially by means of a suitable coating source 21 in the vacuum or coating chamber 19 illustrated in FIG. 1B. By way of example a coating source 21 in the form of a PICVD device can be used to apply a multilayer patterned optical coating 25 by varying the composition of the gas atmosphere for each layer.

The number of layers of the coating 25 illustrated in FIG. 3 is, of course, only illustrative. If, by way of example, an interference filter layer is deposited, there may also be more than three layers 31, 32, 33. In order to quote just one example, a three-layer coating as illustrated in FIG. 2 can be used for patterned blooming.

In general, depending on the purpose, a patterned optical coating 25 as is illustrated in FIG. 1D or 2 may comprise a partially or fully reflective reflection layer, a colored-reflective optical layer, an interference layer and/or a color or absorption layer, as well.

FIGS. 3A to 3D show methods steps for production of a coated substrate according to the invention with a curved surface based on various variants of a further embodiment of the invention. According to this embodiment of the method, as will be described with reference to FIGS. 3A to 3D, the masking of the substrate 1 in this case comprises the application of first masking 35 and of second masking 37, which overlaps the first masking.

Figure 3A:
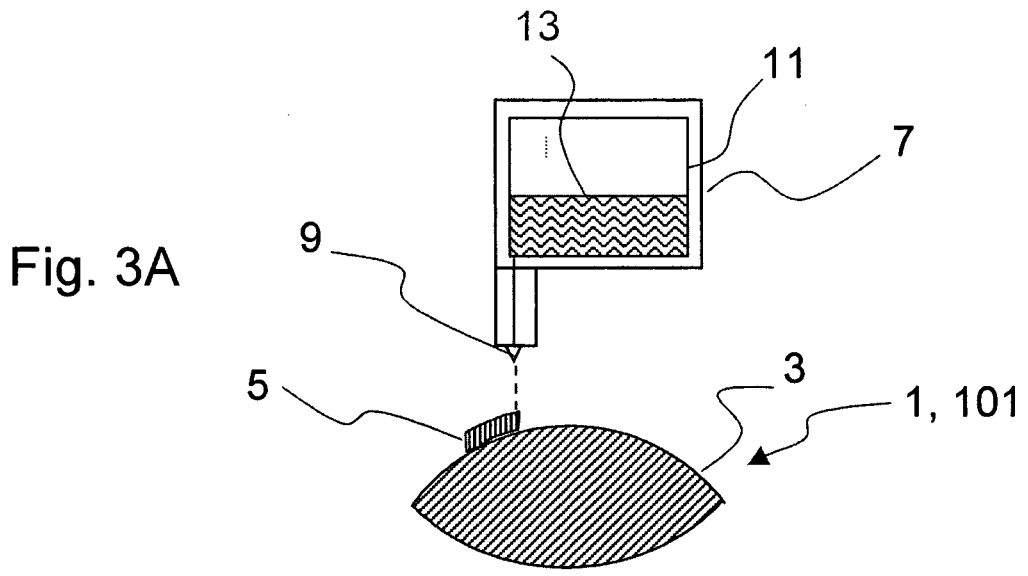

First of all, FIG. 3A shows the masking of the substrate 1 by printing a varnish layer 5 by means of computer-controlled nozzles 9 in a print head 7, as is also illustrated in a similar form in FIG. 1A. An optical lens 101 is used as the substrate 1 in the exemplary embodiment shown in FIG. 3A.

Figure 3B:
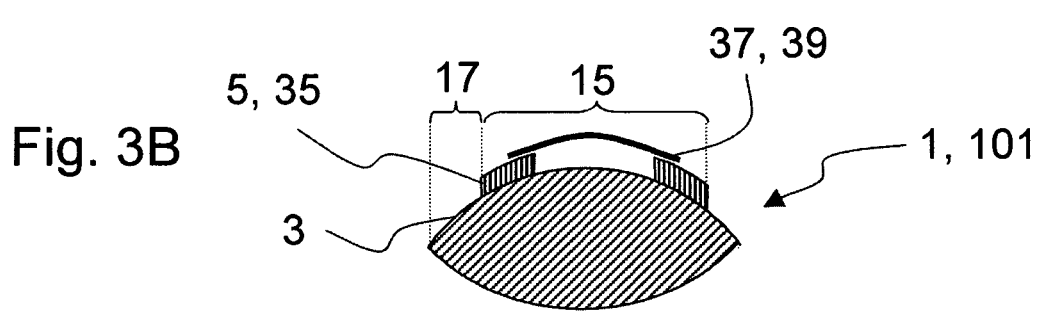
Figure 3C:
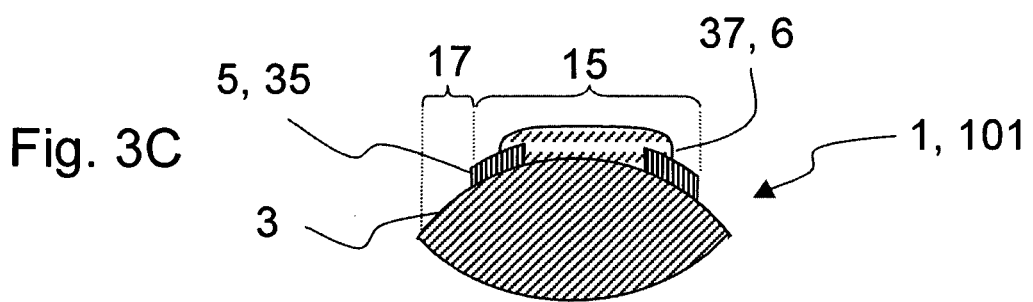
Figure 3D:
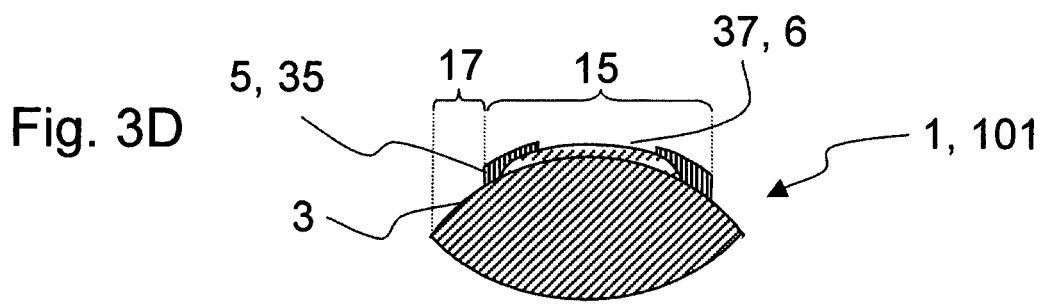

In contrast to the embodiment described with reference to FIGS. 1A to 1D, only an area of the subareas 15 to be masked which is close to the contour is printed, in order to produce first masking 35, which is used to produce clear contours of the pattern of the optical coating to be applied later. The rest of the surface of the subarea or subareas 15 is provided with second masking 37, which overlaps the varnish layer 5, for example the first masking 35. FIGS. 3B to 3D show examples of such overlapping first and second maskings 35, 37.

In the example shown in FIG. 3B, the masking of the substrate comprises the arrangement of a preformed mechanical mask 39 which, in this example, is used as the second masking for the subarea 15 of the curved surface 3. For example, the mask 39 may be a contour mask composed of a plastic film or metal foil, or some other template. The use of a mask such as this is advantageous, for example, when the aim is to avoid excessive outgassing of the varnish layer 5 in a vacuum. The amount of varnish applied can be considerably reduced by the use of a further mask, such as mechanical masking as in this case.

FIGS. 3C and 3D show a further option. In these examples as well, a varnish layer 5 is used as the first masking 35. A second varnish layer 6 is used as the second masking, which overlaps the first masking 35. In the example illustrated in FIG. 3C, the second varnish layer 6, which forms the inner part of the masking of the subarea 15, is applied after the application of the varnish layer 5. The varnish layer 5 in this case forms the contour of the subarea or subareas 15.

However, as will be described with reference to FIG. 3D, it is equally possible first of all to provide the inner part of the area 15 with masking 37 formed by a varnish layer 6, and then to provide the contour-forming edge area with further masking 35, which overlaps the masking 37. Both identical varnishes and different varnishes may be used for the maskings 35, 37 or the varnish layers 5, 6. For example, a stop varnish may be used for the outer masking 35, which can be applied particularly well and accurately and is comparatively temperature-resistant. A pull-off varnish can then be used as the inner masking 37, which can easily be pulled off the curved surface 3.

The substrate 1, masked as shown in FIGS. 3A to 3D, can then be coated, as described with reference to FIGS. 1B to 1D, and the masking can be removed together with the optical coat deposited on it in order to produce a coated substrate 1, as is shown in FIG. 1D or 2. In this case, the mask 39 in the example shown in FIG. 3B may also, alternatively, not be arranged in front of the surface 3 until the substrate has been positioned in the vacuum chamber 19.

Figure 4A:
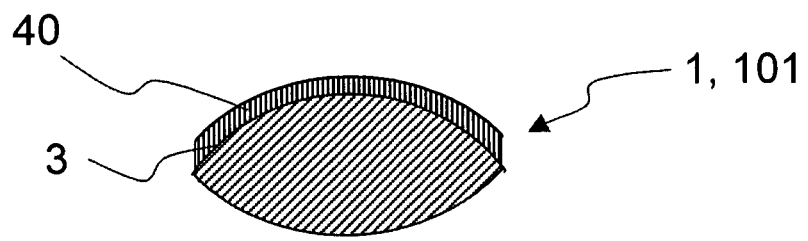
FIGS. 4A and 4B show method steps for masking of a substrate according to yet another embodiment of the invention.
Figure 4B:
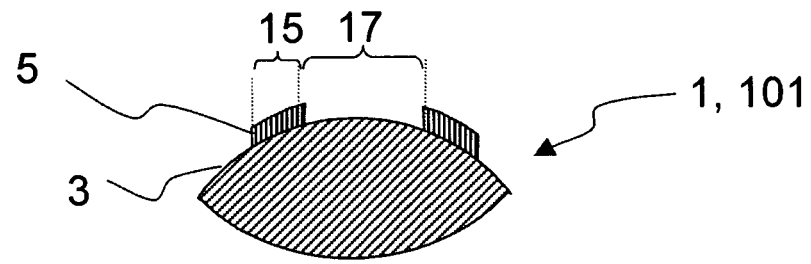

FIGS. 4A and 4B show yet another exemplary embodiment of the masking of the surface 3. In this case as well, an optical lens 101 is provided as the substrate 1 for coating with a patterned optical layer. In this example, the masking is carried out by coating with photoresist and subsequent exposure and development of the photoresist. The coating in the illustrated exemplary embodiment is carried out by application of the photoresist 40 over the surface. The application process may be carried out, for example, in the normal manner by rolling it on. The photoresist 40 is then exposed and developed, corresponding to the desired patterning of the masking, so that a patterned varnish layer 5, which is illustrated schematically in FIG. 4B, is produced as masking on the curved surface 3 of the substrate 1.

The substrate masked in this way can then be treated further as explained with reference to FIGS. 1B to 1D in order to produce a coated substrate according to the invention with a patterned optical coating.

The exemplary embodiments described above have a single optical coating. However, of course, the method according to the invention can also be used to apply two or more different or identical optical coatings which, in particular, may also all be patterned. Exemplary embodiments such as these are illustrated in FIGS. 5 to 7.

Figure 5:
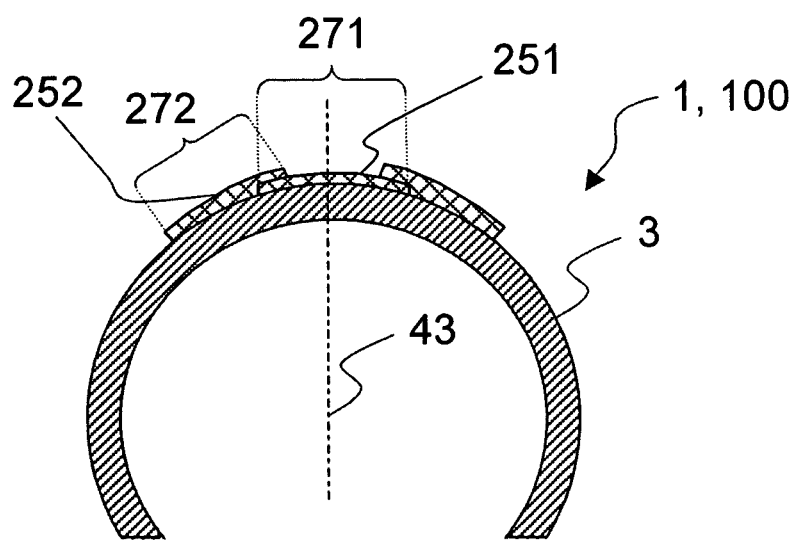
FIG. 5 to FIG. 7 show exemplary embodiments of coated substrates according to the invention with two or more optical coatings.

FIG. 5 shows one exemplary embodiment of a lamp bulb 100 as the substrate 1, on whose curved outer surface two optical coatings 251, 252 have been applied successively using the method according to the invention, for example as described with reference to FIGS. 1A to 1D. The layers 251, 252 respectively cover subareas 271 and 272 of the curved surface 3, with the respective coating 251, 252 being missing in the areas adjacent to the subareas 271 and 272, respectively. The patterned optical layers 251, 252 also overlap in the exemplary embodiment illustrated in FIG. 5. Furthermore, the layer material of the two layers 251 and 252 in the example shown in FIG. 5 may also be the same. However, by way of example, the thickness of the layers 251, 252 may differ, so that the layers produce different optical effects.

In this exemplary embodiment, the patterned optical layer 251 was applied first of all, covering a circular area around the axis of symmetry 43 of the lamp bulb 100, or of the substrate, and accordingly being patterned as a round spot. The second coating 251 was then applied, which is patterned so as to provide an annular subarea 272 of the curved surface 3 with the optical coating, for example being covered by it. This annular pattern of the optical coating 252 overlaps the edge of the layer 251, which is patterned in a circular shape, in the exemplary embodiment shown in FIG. 5.

Figure 6:
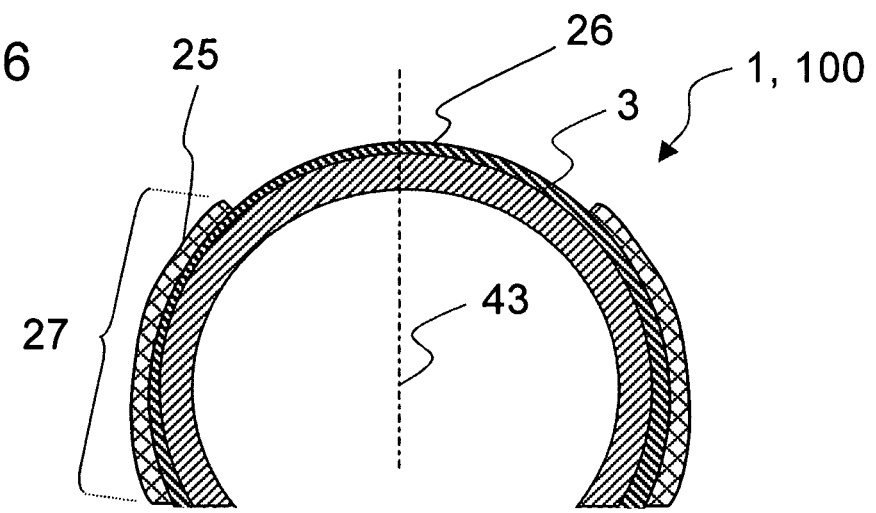
Figure 7:
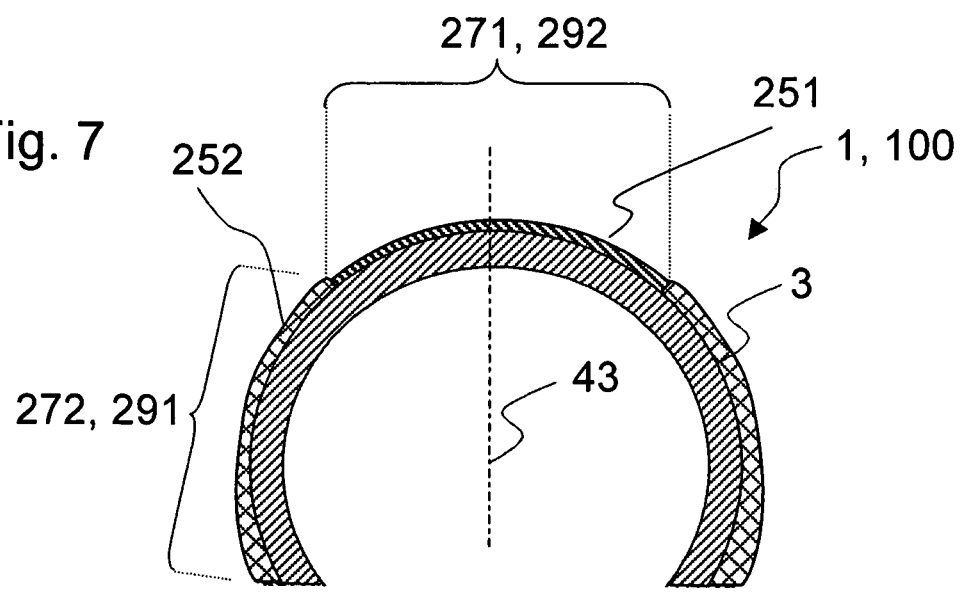

FIG. 6 shows a cross-section view through the substrate 1 of a further exemplary embodiment with a number of optical coatings. In this exemplary embodiment, a first optical coating 26 is applied to the substrate 1, is not patterned and covers the entire curved surface 3. A patterned optical coating 25, applied according to the invention, is located on this and is patterned in a similar form to the optical coating 252 shown in FIG. 5, such that it covers an annular area 27 around the axis of symmetry of the substrate, and leaves free a round area around the axis of symmetry 43, or is not covered by the layer 25.

In the exemplary embodiment illustrated in FIG. 7, two patterned optical coatings 251, 252 with different optical characteristics are deposited on the surface 3. These coatings respectively cover different, non-overlapping subareas 271, 272, without there being any gap between the layers 251, 252. For example, the layers 251, 252 may have different reflection or absorption characteristics.

The method according to the invention allows the layers 251, 252 to be deposited in well-defined form with clear contours. The patterning of the layers may thus, by way of example, be placed so accurately that the two layers 251, 252 are adjacent to one another, as in this example, without any space between them or without any significant gap. The subarea or subareas 271, 272 which are covered by the first patterned optical coating 251 or 252, respectively, thus correspond to the respective subareas 292 and 291, which are in each case left free of the other patterned optical coating 251, 252.

Figure 8:
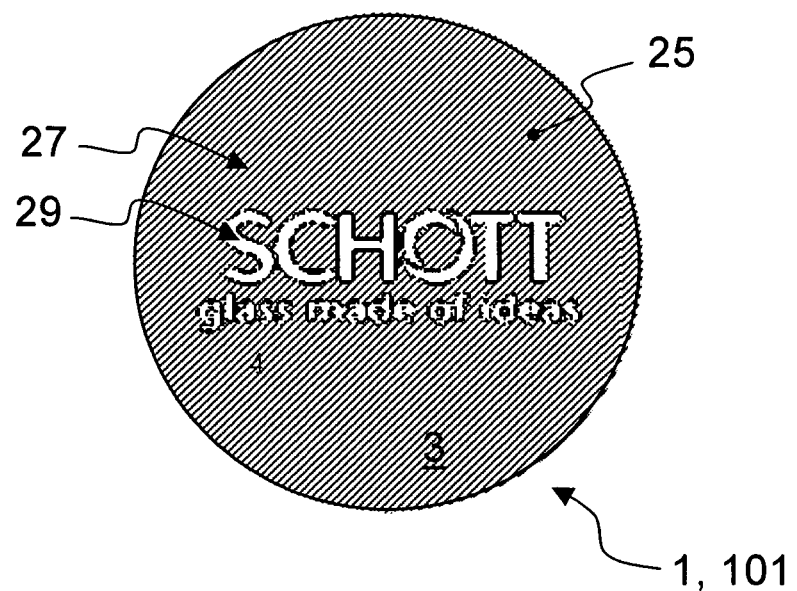
FIGS. 8 and 9 show views of examples of lenses 101 provided with an optical coating according to the invention.
Figure 9:
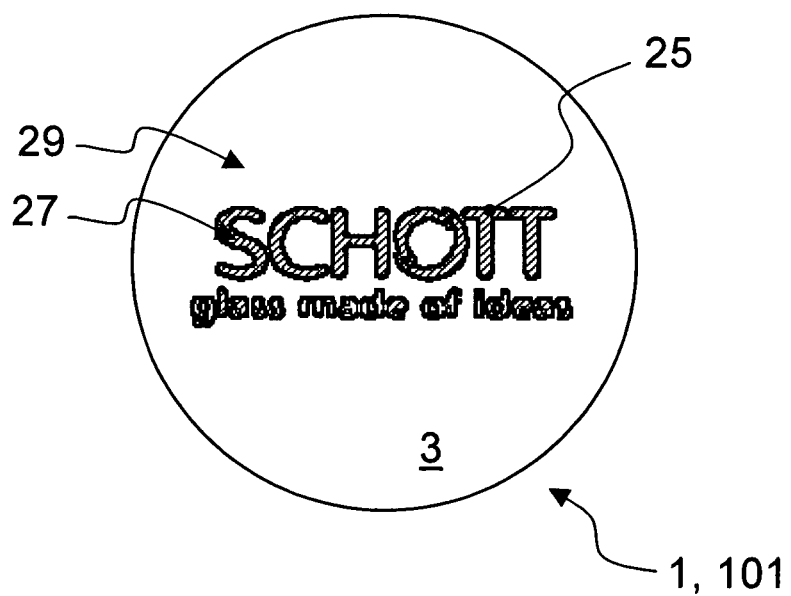

FIGS. 8 and 9 show views of further examples according to the invention of lenses 101 provided with an optical coating as substrates 1. In these exemplary embodiments, the patterned optical coating in each case comprises visible information. FIGS. 8 and 9 show an inscription as the visible information, although the information may also be in the form of a logo or a symbol.

In the exemplary embodiment shown in FIG. 8, the inscription is formed on the curved face 3 of the lens 101 by the uncoated subareas 29 of the curved face 3 in which the optical coating 25, patterned in the form of the inscription, is missing. However, a patterned coating 25 as is illustrated in FIG. 9 is likewise also possible. In this exemplary embodiment, the inscription is formed by the coated subareas 27 of the optical coating, which is patterned to correspond to the inscription.

The optical coating 25 according to the invention, patterned with a logo or inscription, on the lenses 101 in FIGS. 8 and 9 may, in particular, comprise a partially or fully reflective reflection layer, a colored-reflective optical coating, an interference layer and/or a colored or absorption layer.

Figure 10:
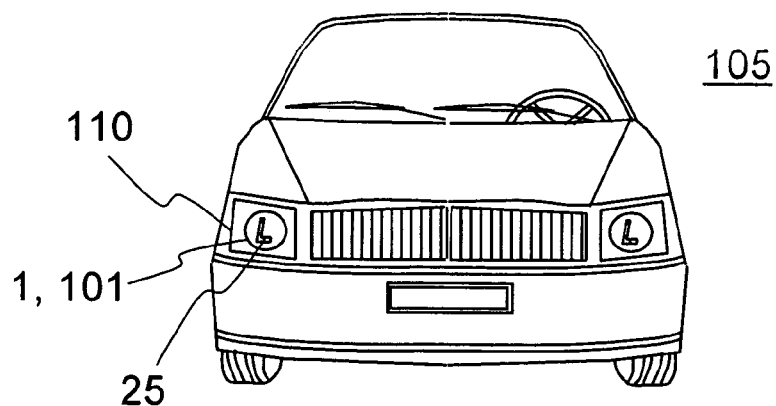
FIG. 10 shows an application example for a lens coated according to the invention.

FIG. 10 shows one exemplary embodiment of lenses coated according to the invention, as are illustrated by way of example in FIG. 8 or 9. FIG. 10 shows the front view of a motor vehicle 105 with spotlights or headlights 110. The spotlights or headlights 110 of motor vehicle 105 each have substrates 1 coated according to the invention in the form of coated projection lenses 101. The optical coating 25 may in this case be provided on one or both refractive surfaces of the lenses 101. The optical coatings 25 on the projection lenses 101 are patterned, in particular in the form of visible information, in a similar manner to the exemplary embodiments shown in FIG. 8 or 9. In particular, in the case of this exemplary embodiment, the coating may be patterned in the form of a logo, with the logo formed by the coating 25 in FIG. 10 being symbolized, only by way of example, in the form of an italic "L". By way of example, the pattern coatings 25 may be patterned in the form of the logo or inscription of the manufacturer of the motor vehicle. This logo is then visible when the spotlight or headlight is switched off or when slightly illuminated, for example when the parking light is switched on, and produces an attractive, decorative effect.

Figure 11:
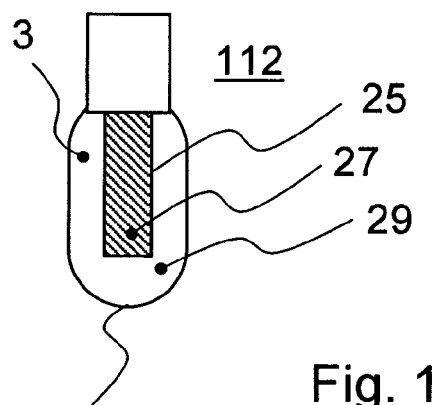
FIG. 11 shows an example of how the light field of a light can be influenced by means of a lamp bulb according to the invention.

In addition or alternatively, it is also possible to use lights having lamp bulbs coated according to the invention, as are illustrated schematically, for example, in FIGS. 1D, 2 and 5 to 7. FIG. 11 shows one exemplary embodiment of a light with advantageous lighting characteristics, in particular for the automobile field as well.

The light in the form of a lamp 112 comprises a lamp bulb 100. By way of example, the lamp bulb 100 has an elongated cylindrical shape with rounded ends. The curved outer face of the lamp bulb 100 is provided with an optical coating 25, which is patterned in such a form that it covers a subarea 27 of the curved surface 3 of the lamp bulb 100, while adjacent subareas 29 remain free. The optical coating 25 may, for example, comprise a multilayer interference filter coating, which colors the emitted light. This coating pattern thus results in a colored and shading effect in a sector or spatial angle range of the light field produced by the light, for example in order to reduce dazzling effects.

Figure 12:
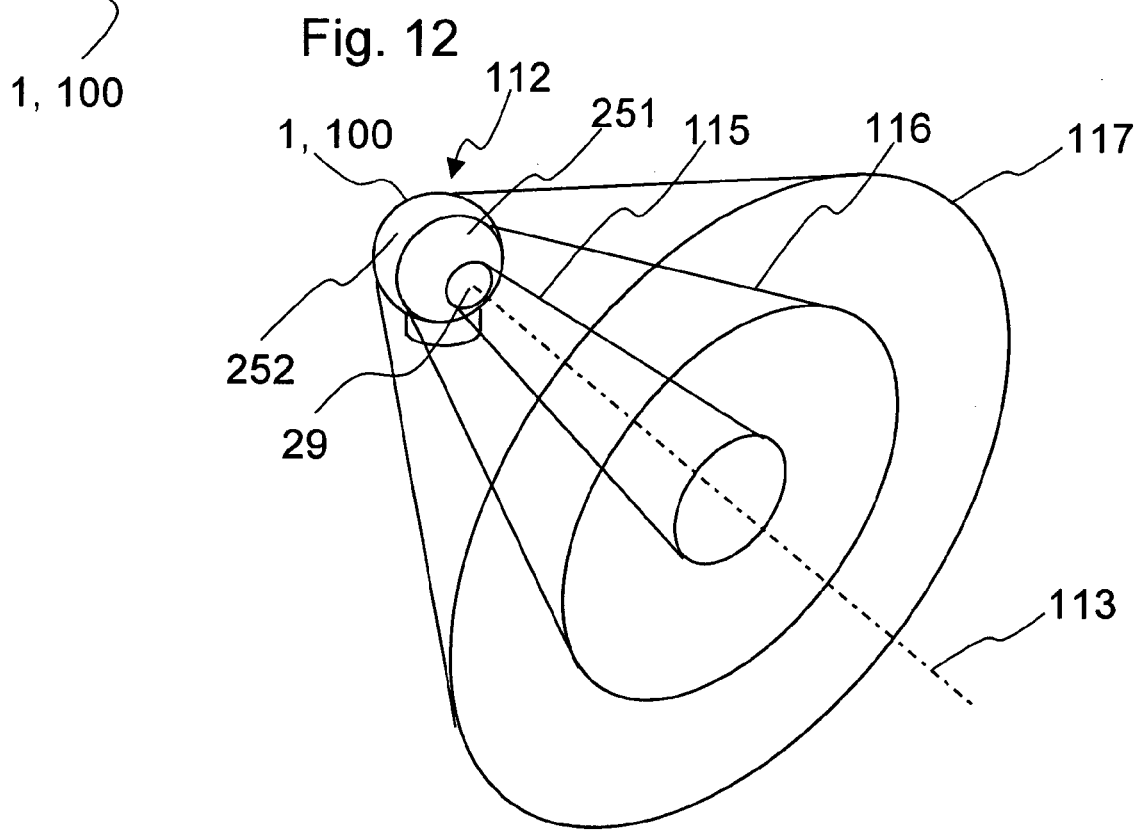
FIG. 12 shows a further example of how the light field of a light can be influenced by means of a lamp bulb according to the invention.

FIG. 12 shows a further example of a light with a coated lamp bulb as may advantageously be used, for example, for motor vehicle spotlights or headlights. The light in the form of a lamp 112 comprises a lamp bulb 100 whose curved outer face is provided with optical coatings 251, 252 which cover annular areas around the axis 113, with a circular area 29 around the axis 113 remaining free in this example, or not being covered by the optical coatings, which have an annular pattern.

The optical layers 251, 252 may, for example, each comprise an interference layer with a number of layers, as is illustrated schematically by way of example in FIG. 2. Optical layers can then be used to provide color and/or brightness filtering of the light emitted from the lamp bulb 100.

The light field which is produced by the light is influenced by the patterning of the optical layers 251, 252. The arrangement that is shown by way of example in FIG. 11 leads, if the optical layers 251, 252 have different color filtering or shading, to differently colored and/or bright spatial angle ranges 115, 116, 117 about the axis 113, for example. This effect can be made use of, for example, to influence the light field of a motor vehicle spotlight or headlight, for example in order to avoid dazzling effects.

The form of the patterning in the exemplary embodiment shown in FIGS. 11 and 12 is, of course, purely illustrative. The optical layers 251, 252 may, for example, also be asymmetrically annular or may cover any other desired shapes of subareas of the curved outer surface of the lamp bulb. The shape of the optical layers and the number of different layers may in this case, in particular, be matched to the desired shape of the light field.

As is obvious to those skilled in the art, the invention is not restricted to the exemplary embodiments described above but, in fact, can be varied in many ways. In particular, the features of the individual exemplary embodiments may also be combined with one another.

List of Reference Symbols

1 Substrate with a curved surface
3 Curved surface of 1
5, 6 Varnish layer
7 Print head
9 Nozzle of 7
11 Tank of 7
13 Varnish
15 Masked subarea of 3
17 Open, unmasked subarea of 3
19 Vacuum or coating chamber
21 Coating source
23 Optical coating
25, 251, 252 Patterned optical coating
26 Optical coating
27, 271, 272 Subarea of 3 covered by 25
29, 291, 292 Uncoated subarea of 3 adjacent to 27
31, 32, 33 Layers of 25
35, 37 Mutually overlapping maskings
39 Mechanical mask
40 Photoresist
43 Axis of symmetry
100 Lamp bulb
101 Lens
105 Motor vehicle
110 Spotlight or headlight
112 Lamp
113 Axis
115, 116, 117 Spatial angle range

The invention claimed is:

1. A method for production of a substrate having a patterned optical coating on a curved surface, comprising:
applying a masking to cover a sub-area of the curved surface, wherein applying the masking comprises applying a first masking and second masking, the second masking partially overlapping the first masking, wherein the first masking defines structured contours and the second masking covers an uncovered sub-area enclosed by the structured contours, wherein applying the masking further comprises printing a varnish layer as the first masking by a computer controlled print head and readjusting a distance between the print head and the curved surface to produce the structured contours, and wherein the method for applying the first masking differs from the method for applying the second masking;
applying an optical coating to the masking and the curved surface using a vacuum deposition method, wherein only an area of the sub-area is printed in order to produce the first masking, which is used to produce clear contours of the optical coating, and wherein the second masking overlaps the first masking, said first masking being precisely structured and having sharp, well defined edges, the second masking being coarser than the first masking; and
removing the masking from the sub-area.

2. The method as claimed in claim 1, wherein the vacuum deposition method comprises a method selected from the group consisting of physical vapor deposition, vapor deposition, sputtering, chemical vapor deposition, and plasma pulse-induced chemical vapor deposition.

3. The method as claimed in claim 1, wherein applying the varnish layer comprises applying by at least one nozzle of the computer-controlled print head.

4. The method as claimed in claim 3, further comprising cooling the varnish layer.

5. The method as claimed in claim 4, wherein the cooling comprises cooling the varnish layer in a supply container connected to the at least one nozzle.

6. The method as claimed in claim 4, wherein cooling the varnish layer comprises cooling the varnish layer by a supply line.

7. The method as claimed in claim 4, wherein cooling the varnish layer comprises cooling the varnish layer by the at least one nozzle.

8. The method as claimed in claim 1, wherein applying the varnish layer comprises applying the varnish layer in compressed atmosphere.

9. The method as claimed in claim 1, wherein applying the varnish further comprises heating the sub-area.

10. The method as claimed in claim 1, wherein the masking comprises a pull-off varnish.

11. The method as claimed in claim 1, wherein the masking comprises stop varnish.

12. The method as claimed in claim 1, wherein removing the masking comprises dissolving or etching the masking.

13. The method as claimed in claim 1, wherein removing the masking comprises swelling the masking.

14. The method as claimed in claim 1, wherein applying the optical coating comprises applying a multilayer optical coating.

15. The method as claimed in claim 1, wherein the optical coating comprises a partially or fully reflective reflection layer.

16. The method as claimed in claim 15, wherein the partially or fully reflective reflection layer further comprises a colored-reflective optical coating.

17. The method as claimed in claim 1, wherein the optical coating comprises an interference layer.

18. The method as claimed in claim 1, wherein the optical coating comprises a color or absorption layer.

19. The method as claimed in claim 1, wherein the substrate is usable as a lamp bulb.

20. The method as claimed in claim 1, wherein the substrate is usable as a lens.

21. The method as claimed in claim 1, wherein applying the varnish layer comprises applying the varnish layer in an atmosphere containing solvent.

22. The method as claimed in claim 1, further comprising applying a different masking to cover a second sub-area of the curved surface, applying a second optical coating to the different masking and the curved surface using a vacuum deposition method, and removing the different masking from the second sub-area.

23. The method as claimed in claim 22, wherein the second optical coating is different than the optical coating.

24. A method for production of a substrate having a patterned optical coating on a curved surface, comprising:
printing a first varnish layer of a first material on the substrate to cover a sub-area of the curved surface so as to define structured contours by a computer controlled print head and readjusting a distance between the print head and the curved surface to produce the structured contours, the first varnish layer being precisely structured having sharp, well defined edges;

printing a second varnish layer of a second material to partially overlap the first varnish layer and to cover an uncovered sub-area enclosed by the structured contours, wherein the second masking is applied by initial masking using a pull-off varnish or initial masking using a mechanical mask, the second varnish layer being coarser than the first varnish layer, the first and second varnish layers being only printed on a partial region of the sub-area;

vacuum depositing an optical coating on the first and second varnish layers and the curved surface; and removing the first and second varnish layers from the sub-area.

25. A method for production of a substrate having a patterned optical coating on a curved surface, comprising:

printing, using a first masking method, a first varnish layer of a first material on the substrate to partially cover a sub-area of the curved surface so as to define structured contours having sharp, well-defined edges;

printing, using a second masking method, a second varnish layer of a second material to partially overlap the first varnish layer and to cover an uncovered sub-area enclosed by the structured contours, the second masking method being different than the first masking method so that the second varnish layer is coarser than the first varnish layer;

vacuum depositing an optical coating on the first and second varnish layers and the curved surface; and removing the first and second varnish layers from the sub-area.

* * * * *